United States Patent
Dietrich et al.

(10) Patent No.: US 7,005,604 B2
(45) Date of Patent: Feb. 28, 2006

(54) OPERATING METHOD FOR A LASER MACHINING SYSTEM

(75) Inventors: Stefan Dietrich, Karlsruhe (DE); Johannes Schuchart, Taipei (TW)

(73) Assignee: Siemens Aktiengesellschaft, München ( * ) Notice: Subject to any disclaimer, the term of this patent is extended or adjusted under 35 U.S.C. 154(b) by 184 days.

(21) Appl. No.: 10/933,250

(22) Filed: Sep. 3, 2004

(65) Prior Publication Data

US 2005/0035098 A1 Feb. 17, 2005

Related U.S. Application Data

(63) Continuation of application No. PCT/DE03/00577, filed on Feb. 24, 2003.

(51) Int. Cl.
*B23K 26/36* (2006.01)
*B23K 26/38* (2006.01)

(52) U.S. Cl. ............... 219/121.71; 219/121.76; 219/121.82

(58) Field of Classification Search ............ 219/121.67–121.72, 219/219/219/121.76, 219/121.82, 121.85
See application file for complete search history.

(56) References Cited

U.S. PATENT DOCUMENTS 5,006,999 A * 4/1991 Kuno et al. ............... 700/253
5,126,532 A 6/1992 Inagawa et al.

(Continued)

FOREIGN PATENT DOCUMENTS

DE 3525656 A1 2/1986
DE 3540316 A1 5/1987

(Continued)

OTHER PUBLICATIONS

Derwent Abstract—FR-2 526 700; Nov. 18, 1983; Fa. Friedrich Kessler, Werkzeug– und Maschinenbau, Germany.
Derwent Abstract—EP-0 610 658A1; Aug. 17, 1994; Ford–Werke Aktiengesellschaft, D-50725 Köln & Ford Motor Company Ltd., GB-Brentwood Essex CM13 3BW.
Derwent Abstract—EP-0 560 240A1; Sep. 15, 1993; Form-d-Werke Aktiengesellschaft, D-50725 Köln, Germany.
Derwent Abstract—DE-3525656A1; Feb. 13, 1986; Scharmann GmbH & Co. D-4050 Mönchengladbach, Germany.
Derwent Abstract—DE-4191062C2; Sep. 19, 1996; Hitachi Seiko Ltd, JP-Kanagawa, Japan.
Derwent Abstract—DE-3540316A1; May 14, 1987; Siemans AG, D-1000 Berlin and D-8000 München, Germany.

*Primary Examiner*—Samuel M. Heinrich
(74) *Attorney, Agent, or Firm*—Jacob Eisenberg Siemens AG

(57) ABSTRACT

The invention relates to an operating method and a trolley for a system used for machining objects by using laser beams, particularly for a system used for boring or structuring substrates. The system has a great number of slow-working laser machining machines than rapid working laser machining machines. A rapid-working laser machining machine utilized afterwards or beforehand can be better used to capacity due to the parallel operation of a number of slow-working laser machining machines. The transfer of objects to be machined or already machined objects is preferably effected by means of trolleys, which are both compatible with both the loading stations and the unloading stations of the laser machining machines. This enables the objects, which are to be machined, to be directly received by a trolley located in a loading station and, after machining, to be placed in a trolley that is introduced into an unloading station of a laser machining machine.

8 Claims, 1 Drawing Sheet

U.S. PATENT DOCUMENTS

| | | | | |
|---|---|---|---|---|
| 5,847,960 A | * | 12/1998 | Cutler et al. | 700/187 |
| 5,847,990 A | | 12/1998 | Irrinki et al. | |
| 5,868,950 A | | 2/1999 | Noddin | |
| 5,922,224 A | * | 7/1999 | Broekroelofs | 219/121.72 |
| 6,657,159 B1 | * | 12/2003 | McKee et al. | 219/121.71 |
| 6,841,482 B1 | * | 1/2005 | Boyle | 438/708 |

FOREIGN PATENT DOCUMENTS

| | | |
|---|---|---|
| DE | 4191062 C2 | 9/1996 |
| EP | 0 560 204 A1 | 9/1993 |
| EP | 0 610 658 A1 | 8/1994 |
| FR | 2 526 700 | 11/1983 |
| GB | 2 175 737 A | 12/1986 |
| JP | 01266983 | 10/1989 |

\* cited by examiner

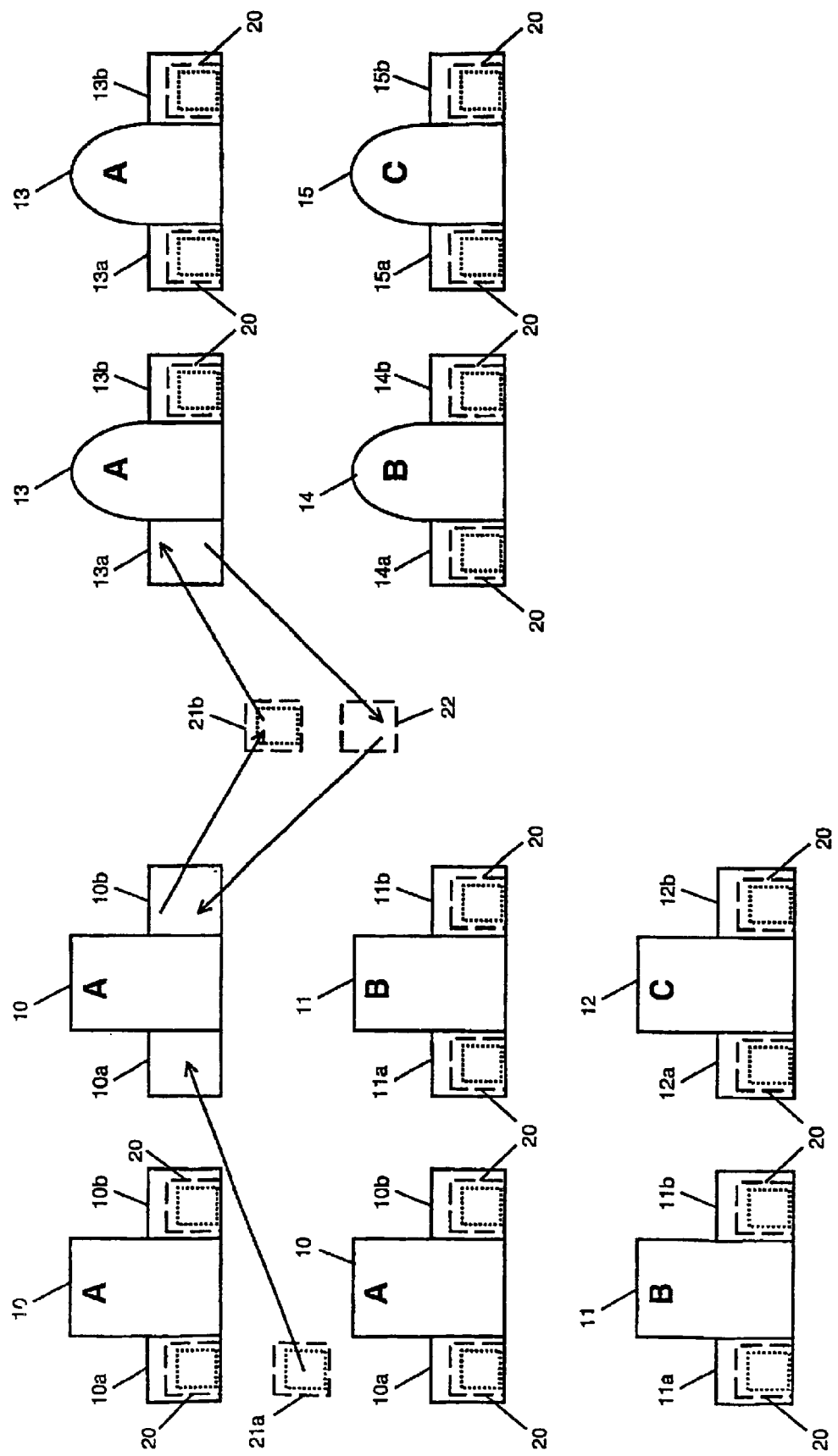

OPERATING METHOD FOR A LASER MACHINING SYSTEM

CROSS REFERENCE TO RELATED APPLICATIONS

The present invention is a continuation of international application serial number PCT/DE03/00577, filed on Feb. 24, 2003, which designated the United States and further claims priority to German patent application DE10210040.3, filed on Mar. 7, 2002, the both of which are herein incorporated by reference.

BACKGROUND OF THE INVENTION

The invention relates to an operating method for a system used for machining objects by means of laser beams, particularly for a system for boring or structuring printed circuit boards and/or electronic components.

The machining of materials using laser beams has become increasingly important due to the rapid development of laser technology in recent years. In the field of electronic components manufacture in particular the increasing miniaturization of components has made the laser machining of printed circuit boards and substrates as well as electronic components an indispensable tool to allow the microstructuring of components and substrates required by component miniaturization. For example holes can be bored in substrates with significantly smaller diameters than the diameters of holes bored with conventional drills. Provided that the laser power of the laser beam striking the substrate is known precisely, blind holes can be bored as well as through holes and these are particularly important for multilayer printed circuit boards, with which a number of metal layers are separated from each other in an electrically non-conducting manner by dielectric intermediate layers. Subsequent coating of a blind hole with metal allows different metal layers of the multilayer printed circuit board to be connected together in an electrically conducting manner, so that the integration density on such a multilayer substrate can be increased significantly compared with single-layer or double-layer substrates.

The laser-boring of multilayer substrates is generally effected by means of two different process stages. In the one process stage the metal layers, which generally contain copper or a copper alloy, are removed locally using a laser beam in the ultraviolet spectral range. In the other process stage a dielectric intermediate layer is removed locally using an infrared laser beam, which is generally generated by a $CO_2$ laser. This means that what are known as UV laser machining machines with a laser light source emitting in the ultraviolet spectral range and what are known as IR laser machining machines with a laser light source emitting in the infrared spectral range are used to bore multilayer substrates. If the IR laser machining machines use a $CO_2$ laser to generate the IR laser beam, these are also referred to as $CO_2$ laser machining machines.

A so-called combination laser machining machine is known from U.S. Pat. No. 5,847,960, which contains both a laser emitting in the ultraviolet spectral range and a laser emitting in the infrared spectral range. Combination laser machining machines have the disadvantage that the machining speed is significantly slower with the laser emitting in the ultraviolet spectral range than the machining speed with the laser emitting in the infrared spectral range. Utilization of the capacity of the combination laser machining machine is therefore generally poor. Separate laser machining machines have therefore prevailed for the machining of multilayer printed circuit boards.

SUMMARY OF THE INVENTION

The object of the invention is to create an operating method for machining substrates and electronic components, which ensures a high level of use of the capacity of the laser machining machines used that operate at different speeds. The object is achieved by an operating method for a system for machining objects using laser beams.

The invention is based on the knowledge that, when using a plurality of laser machining machines with different machining speeds, utilization of the capacity of a laser machining system can be increased by using a larger number of what are known as slow-working laser machining machines than the number of what are known as rapid-working laser machining machines. The parallel operation of a plurality of slow-working laser machining machines means that an equal number or at least an approximately equal number of objects can be machined with both types of laser machining machines within a specific time period. Improved utilization of the capacity of a laser machining system has the advantage that in total fewer laser machining machines are required for a specific machining capacity requirement and therefore both the space required for such a system and the operating costs of the laser machining system can be significantly reduced.

According to one embodiment objects are supplied using a transport system, which can be configured for example as a transport or conveyor belt, so that the objects are supplied quasi-continuously.

According to another embodiment objects are both supplied to a loading station of the corresponding laser machining machine and removed from an unloading station of the respective laser machining machine not continuously but discretely in specific quantities. Discrete transport of the objects has the advantage that there is no need for expensive transport or conveyor belts and transport of the objects can be effected manually in a simple manner and therefore at low cost.

According to another embodiment at least two trolleys are used as the transport system and these can preferably be introduced into the respective loading station or unloading station, so that the objects to be machined can be supplied directly for laser machining from the one trolley in the loading station and can be deposited directly in the other trolley in the unloading station after machining.

According to another embodiment development is preferably achieved using a $CO_2$ laser.

According to another embodiment the development is preferably achieved using a frequency-multiplied Nd:YAG, Nd:YVO$_4$ or argon ion laser.

According to another embodiment multilayer objects comprising electrically insulating dielectric layers and electrically conducting metal layers are machined so that printed circuit boards or substrates can be produced, with which a high level of integration density of electronic components can be achieved.

According to another embodiment holes are bored in the objects to be machined. The bored holes can be through holes or what are known as blind holes as required.

BRIEF DESCRIPTION OF THE SEVERAL VIEWS OF THE DRAWINGS

Further advantages and features of the present invention will emerge from the exemplary description below of a currently preferred embodiment.

The single FIGURE shows a schematic illustration of the structure and logical operating sequence of a laser machining machine, which comprises laser machining machines operating at different speeds and which is used to machine three different objects A, B, C.

DETAILED DESCRIPTION OF THE INVENTION

As shown in the FIGURE, the laser machining system used comprises a total of six UV laser machining machines 10, 11, 12 to bore holes in multilayer printed circuit boards. Of the six UV laser machining machines, three UV laser machining machines 10 are used to machine a printed circuit board type A. Two UV laser machining machines 11 are used to machine a different printed circuit board type B. A further UV laser machining machine 12 is used to machine a third printed circuit board type C. The laser machining system according to the exemplary embodiment shown here also comprises four $CO_2$ laser machining machines 13, 14, 15, whereby the two $CO_2$ laser machining machines 13 are used to machine printed circuit board type A, the $CO_2$ laser machining machine 14 is used to machine printed circuit board type B and the $CO_2$ laser machining machine 15 is used to machine printed circuit board type C. Each of the total of ten laser machining machines shown in the FIGURE comprises a loading station 10a, 11a, 12a, 13a, 14a, 15a and an unloading station 10b, 11b, 12b, 13b, 14b, 15b. The printed circuit boards to be machined are each transported from the corresponding loading station 10a, 11a, 12a, 13a, 14a, 15a by means of a handling device (not shown) to the machining area within the respective laser machining machine 10, 11, 12, 13, 14, 15. When the corresponding printed circuit board has been machined, it is transported from the machining area to the corresponding unloading station 10b, 11b, 12b, 13b, 14b, 15b. The printed circuit boards are transported between the individual laser machining machines 10, 11, 12, 13, 14, 15 using a trolley 20, 21a, 21b, 22 which can hold a plurality of printed circuit boards, which are preferably arranged in a stack. The trolleys 20, 21a, 21b, 22 are configured such that they can be introduced into the loading stations 10a, 11a, 12a, 13a, 14a, 15a and the unloading stations 10b, 11b, 12b, 13b, 14b, 15b of each of the laser machining machines 10, 11, 12, 13, 14, 15 shown so that during operation of a laser machining machine 10, 11, 12, 13, 14, 15 a trolley 20 generally at least partially loaded with printed circuit boards is present both in the loading station 10a, 11a, 12a, 13a, 14a, 15a and the respective unloading station 10b, 11b, 12b, 13b, 14b, 15b.

To ensure a smooth and interruption-free production operation a variable number of currently unused trolleys can also be positioned at specific points. For space-saving reasons such a stock of trolleys is advantageous particularly in the vicinity of the three loading stations 10a, 11a of the three laser machining machines 10, 11 shown on the left in the FIGURE and in the vicinity of the two unloading stations 13b, 15b of the two laser machining machines 13, 15 shown on the right in the FIGURE.

The sequence of the transfer of printed circuit boards is described below using the example of a transfer from the UV laser machining machine 10, which is shown in the FIGURE in the second column from the left at the top, to the $CO_2$ laser machining machine 13, which is shown in the FIGURE in the third column from the left at the top. After a specific number of printed circuit boards have been machined using the laser machining machine 10 and deposited in the trolley introduced into the unloading station 10b, the generally fully laden trolley 21b is removed from the unloading station 10b and introduced into a loading station 13a of a $CO_2$ laser machining machine 13, which is then used to carry out further machining stages on the printed circuit boards in the trolley 21b. At the same time (a) an empty trolley 22, which was previously introduced into the loading station 13a of the $CO_2$ laser machining machine 13, is introduced into the now empty space at the unloading station 10b of the UV laser machining machine 10 and (b) an empty trolley (not shown) is removed from the loading station 10a and replaced with a fully laden trolley 21a. In this way a plurality of printed circuit boards can be machined one after the other using different machining machines, whereby it is not necessary to interrupt the machining of printed circuit boards in any of the laser machining machines for a period of significant length.

As the period of time taken by the $CO_2$ laser machining machine 13 to machine the printed circuit boards supplied to it is shorter than the period of time required by the different UV laser machining machines 10 to machine the same number of printed circuit boards, after the printed circuit boards supplied using the trolley 21b have all been machined, a further fully laden trolley is introduced into the loading station 13a, whereby this further, generally fully laden, trolley contains those printed circuit boards, which were machined beforehand using one of the two other UV laser machining machines 10 shown in the left column of the FIGURE.

The corresponding transport and the corresponding supply of different printed circuit boards machined using slow-working laser machining machines to a rapid-working laser machining machine 14 is effected according to the exemplary embodiment outlined here, also with type B printed circuit boards.

As the machining time for type C printed circuit boards is approximately of equal length on both types of laser machining machine according to the exemplary embodiment described here, a UV laser machining machine 12 and a $CO_2$ laser machining machine 15 are used to machine the type C printed circuit boards, so that each of the printed circuit boards machined by the $CO_2$ laser machining machine 15 was previously machined by the UV laser machining machine 12.

It should be pointed out that the invention is not restricted to specific ratios between the number of slow-working laser machining machines 10, 11, 12 and the number of rapid-working laser machining machines 13, 14, 15. Depending on the machining time of the machining operation effected using the different laser machining machines, the ratio between the number of rapid-working laser machining machines 13, 14, 15 and the number of slow-working laser machining machines 10, 11, 12 can be selected freely for efficient utilization of the capacity of the entire laser machining system.

It should also be pointed out that according to the invention the machining sequence is not restricted to the printed circuit boards first being machined using the slow-working laser machining machines 10, 11, 12 and then using the rapid-working laser machining machines 13, 14, 15. Machining can first be carried out using rapid-working laser machining machines and then using slow-working laser machining machines. Certain printed circuit boards may also require a machining operation that alternates a number of times between machining using a slow-working laser machining machine and machining using a rapid-working laser machining machine.

To summarize, the invention creates an operating method for a system for machining objects using laser beams, particularly for a system for boring or structuring substrates.

The system has a greater number of slow-working laser machining machines 10, 11 than rapid-working laser machining machines 13, 14. A rapid-working laser machining machine 13, 14 utilized afterwards or beforehand can be better used to capacity due to the parallel operation of a number of slow-working laser machining machines 10, 11. The transfer of objects to be machined or already machined objects is preferably effected by means of trolleys 20, which are compatible with both the loading stations 10*a*, 11*a*, 12*a*, 13*a*, 14*a*, 15*a* and the unloading stations 10*b*, 11*b*, 12*b*, 13*b*, 14*b*, 15*b* of the laser machining machines 10, 11, 12, 13, 14, 15. This enables the objects, which are to be machined, to be directly received by a trolley 20 located in a loading station 10*a*, 11*a*, 12*a*, 13*a*, 14*a*, 15*a* and, after machining, to be placed in a trolley 20 that is introduced into an unloading station 10*b*, 11*b*, 12*b*, 13*b*, 14*b*, 15*b* 12*b*, 13*b*, 14*b*, 15*b* of a laser machining machine 10, 11, 12, 13, 14, 15.

We claim:

1. A method of machining objects using laser beams, the method applicable to a system for boring or structuring multilayer printed circuit boards and/or electronic components, the system having at least two slow-working laser machining machines and at least one rapid-working laser machining machine, the method comprising the steps of:

machining a first number of objects using a first slow-working laser machining machine, machining a second number of objects using a second slow-working laser machining machine, and machining a further number of objects with a rapid-working laser machining machine, the further number being larger than the first and second numbers, whereby operating sequences of the laser machining machines are coordinated such that:

after machining with the first or second slow-working laser machining machine, the first and second number of objects are supplied in an alternating manner to the rapid-working laser machining machine for further machining, or the further number of objects are divided into at least a first and a second subsets after machining, using the rapid-working laser machining machine, whereby the first subset is supplied to the first slow-working laser machining machine and the second subset is supplied to the second slow-working laser machining machine for further machining.

2. The method according to claim 1, wherein objects are supplied via a transport system.

3. The method according to claim 2, wherein:

objects to be machined are collected from a loading station assigned to a respective laser machining machine and already machined objects are deposited at an unloading station assigned to the respective laser machining machine, and at about a same time, a plurality of objects are supplied to the loading station and a plurality of objects are removed from the unloading station using the transport system.

4. The method according to claim 3, wherein at least two trolleys are used as the transport system, such that:

a first trolley is coupleable to a loading station of an upstream laser machining machine, a second trolley is coupleable to an unloading station of the upstream laser machining machine, and the second trolley is further coupleable to a loading station of a downstream laser machining machine connected downstream to the upstream laser machining machine such that objects to be machined are machined after being machined using the downstream laser machining machine.

5. The method according to claim 1, wherein lasers of the slow working laser machining machine operate in a mean or remote infrared spectral range.

6. The method according to claim 1, wherein lasers of the rapid-working laser machining machine operate in a visible or ultraviolet spectral range.

7. The method according to claim 5, further comprising the steps of machining multilayer objects whereby dielectric layers are removed using the slow-working laser machining machines and metal intermediate layers are removed using the rapid-working laser machining machine.

8. The method according to claim 1, further comprising the step of boring holes into objects to be machined.

* * * * *